(12) United States Patent  
Yuan

(10) Patent No.: US 9,100,050 B2  
(45) Date of Patent: Aug. 4, 2015

(54) METHOD AND DEVICE FOR IMPLEMENTING VITERBI DECODING

(75) Inventor: Wei Yuan, Shenzhen (CN)

(73) Assignee: ZTE CORPORATION (CN)

( * ) Notice: Subject to any disclaimer, the term of this patent is extended or adjusted under 35 U.S.C. 154(b) by 70 days.

(21) Appl. No.: 13/823,440

(22) PCT Filed: Apr. 18, 2011

(86) PCT No.: PCT/CN2011/072957  
§ 371 (c)(1),  
(2), (4) Date: Mar. 14, 2013

(87) PCT Pub. No.: WO2012/034398  
PCT Pub. Date: Mar. 22, 2012

(65) Prior Publication Data  
US 2013/0185616 A1  Jul. 18, 2013

(30) Foreign Application Priority Data  
Sep. 15, 2010 (CN) .......................... 2010 1 0284258

(51) Int. Cl.  
H03M 13/03 (2006.01)  
H03M 13/25 (2006.01)  
H03M 13/41 (2006.01)  
H03M 13/00 (2006.01)

(52) U.S. Cl.  
CPC .......... *H03M 13/25* (2013.01); *H03M 13/4107* (2013.01); *H03M 13/4169* (2013.01); *H03M 13/6561* (2013.01)

(58) Field of Classification Search  
CPC ............ H03M 13/41; H03M 13/4107; H03M 13/6502; H03M 13/3961; G11B 20/10009  
USPC ........................................................ 714/795  
See application file for complete search history.

(56) References Cited

U.S. PATENT DOCUMENTS 5,907,586 A * 5/1999 Katsuragawa et al. ....... 375/341  
6,389,574 B1 * 5/2002 Belveze et al. ............... 714/795  
(Continued)

FOREIGN PATENT DOCUMENTS

CN  1307432  8/2001  
CN  1323102  11/2001  
(Continued)

OTHER PUBLICATIONS

International Search Report for International Patent Application No. PCT/CN2011/072957, mailed Jul. 28, 2011.

*Primary Examiner* — Albert Decady  
*Assistant Examiner* — Enam Ahmed  
(74) *Attorney, Agent, or Firm* — McAndrews, Held & Malloy, Ltd.

(57) ABSTRACT

The disclosure provides a method and device for implementing Viterbi decoding. The method comprises the following steps: calculating branch path measurement values of received code words and reference code words; parallel accumulating the branch path measurement values and measurement values corresponding to states to obtain accumulated values according to a state transition diagram, selecting a maximum accumulated value as a new measurement value of a next state, and saving all survival path selection results until data for decoding ends; and starting traceback from a final state to obtain decoded data according to the survival path selection results. In the disclosure, by modifying the traditional serial or serial-parallel mixed mode for calculating accumulated path measurement values to a multi-path fully-parallel calculation mode, the throughput rate of the system data is improved, and the decoding delay is merely in μs level.

12 Claims, 7 Drawing Sheets

(56) References Cited

U.S. PATENT DOCUMENTS

| | | | |
|---|---|---|---|
| 8,009,773 B1 * | 8/2011 | Kankipati et al. | 375/341 |
| 2002/0095639 A1 * | 7/2002 | Ahmed et al. | 714/786 |
| 2007/0115960 A1 * | 5/2007 | Yin | 370/389 |

FOREIGN PATENT DOCUMENTS

| | | |
|---|---|---|
| CN | 101090274 | 12/2007 |
| WO | 96/31953 | 10/1996 |

* cited by examiner

METHOD AND DEVICE FOR IMPLEMENTING VITERBI DECODING

FIELD OF THE INVENTION

The present disclosure relates to the field of communication, in particular to a method and a device for implementing Viterbi decoding.

BACKGROUND OF THE INVENTION

In wireless transmission, the received data contains a large amount of error codes as the channel is relatively poor. Therefore, transmission signals must be encoded and error corrected. The purpose of channel encoding is to resist against various noises and interferences during the transmission process, by adding redundant information manually, a system is provided with a capability of automatic error correction, so as to guarantee the reliability of digital transmission. With the development of the wireless digital communication technology and the appearance of high-rate strong-abruptness services, people propose more demanding requirements on the error correction encoding technology.

At first, error code correction is mainly concentrated in linear block codes based on algebraic theory, and then Hamming codes, RS codes, cyclic codes or the like. However, effect in solving practical problems is limited. Register is introduced into the encoding process of convolutional codes appearing in the fifties, and correlation between code elements is added, so that a higher encoding gain than that of block codes is obtained under a same complexity. There are three grid termination policies for convolutional codes:

Direct truncation: no any information about the final state of grid is provided to the decoder;

Zero termination: tail bit 0 is added behind the information bit and then encoding is carried out, in order to ensure that the grid returns to a specific state 0;

Tail biting: it has a special way—zero termination, the main feature of which is that no tail bit needs to be added. Tail biting means that: before one code block is encoded, the initial state of the convolutional code encoder is set as the final several bits of the code block, for cyclic convolutional codes, after the encoding process ends, the encoder returns to the initial state, so the decoding grid may be regarded as a circle, initialization may be realized in the case of decoding at any position of the circle, therefore, the corresponding decoding may be regarded as spinning cyclic decoding.

For convolutional encoding, there are many corresponding decoding algorithms, but among these algorithms, the most effective and most practical decoding algorithm is maximum likelihood decoding, i.e., Viterbi decoding algorithm. In order to improve the code rate of convolutional codes and meet the application of high-speed systems such as Long Term Evolution (LTE), tail biting convolutional encoder is employed in most solutions, the corresponding convolutional decoder needs larger storage space, and the complexity of calculation is also higher.

SUMMARY OF THE INVENTION

The main purpose of the present disclosure is to provide a method and device for implementing Viterbi decoding, in order to save the storage space of calculation for the convolutional decoding and improve the working efficiency of decoding.

The present disclosure provides a method for implementing Viterbi decoding, comprising:

Calculating branch path measurement values of received code words and reference code words;

Parallel accumulating the branch path measurement values and measurement values corresponding to states to obtain accumulated values according to a state transition diagram, selecting a maximum accumulated value as a new measurement value of a next state, and saving all survival path selection results until data for decoding ends; and Starting traceback from a final state to obtain decoded data according to the survival path selection results.

Preferably, before calculating the branch path measurement values of the received code words and the reference code words, the method further comprises:

Storing the data for decoding, which is input externally, in a mode of interleaved memory; and reading the data for decoding according to an external decoding instruction.

Preferably, parallel accumulating the branch path measurement values and the measurement values corresponding to the states to obtain the accumulated values according to the state transition diagram, selecting maximum accumulated value as the new measurement value of the next state, and saving all survival path selection results until the data for decoding ends comprises:

Multi-path fully-parallel accumulating the branch path measurement values and the measurement values corresponding to the states to obtain the accumulated values according to the state transition diagram;

Selecting the maximum accumulated value as the new measurement value of the next state according to the add-compare-select rule, and saving all survival path selection results; and Returning to execute a next accumulation operation when an accumulation time is less than a preset accumulation time; and ending the accumulation flow when the accumulation time is more than or equal to the preset accumulation time.

Preferably, after multi-path fully-parallel accumulating the branch path measurement values and the measurement values corresponding to the states to obtain the accumulated values according to the state transition diagram, the method further comprises:

Subtracting 1 from the secondary highest bit in the significant bits of each accumulated value to obtain a new accumulated value, if the highest bit in the significant bits of the accumulated value corresponding to state 0 is 1, then using the new accumulated value as the result of this accumulation operation.

Preferably, the traceback depth is two times of the encoding length.

The present disclosure provides a device for implementing Viterbi decoding, comprising: a branch path measurement module, an add-compare-select module and a traceback module; wherein, The branch path measurement module is configured to calculate branch path measurement values of received code words and reference code words;

The add-compare-select module is configured to parallel accumulate the branch path measurement values and measurement values corresponding to states to obtain accumulated values according to a state transition diagram, select a maximum accumulated value as a new measurement value of a next state, and save all survival path selection results until data for decoding ends; and The traceback module is configured to start traceback from a final state to obtain decoded data according to the survival path selection results.

Preferably, the device further comprising:

An input data storage module, configured to store the data for decoding, which is input externally, in a mode of interleaved memory; and read the data for decoding according to an external decoding instruction.

Preferably, the add-compare-select module comprises: an accumulation unit, a selection unit, a survival path storage unit and a judgment unit; wherein, The accumulation unit is configured to multi-path fully-parallel accumulate the branch path measurement values and measurement values corresponding to the states to obtain the accumulated values according to the state transition diagram;

The selection unit is configured to select the maximum accumulated value as the new measurement value of the next state according to the add-compare-select rule;

The survival path storage unit is configured to save all survival path selection results; and The judgment unit is configured to return to execute a next accumulation operation of the accumulation unit when an accumulation time is less than a preset accumulation time; and end the accumulation flow when the accumulation time is more than or equal to the preset accumulation time.

Preferably, the add-compare-select module further comprises:

An anti-overflow unit, configured to subtract 1 from the secondary highest bit in the significant bits of each accumulated value to obtain a new accumulated value, if the highest bit in the significant bits of the accumulated value corresponding to state 0 is 1, then use the new accumulated value as the result of this accumulation operation.

Preferably, the traceback depth employed by the traceback module is two times of the encoding length.

In the disclosure, by modifying the traditional serial or serial-parallel mixed mode for calculating the accumulated path measurement values to a multi-path fully-parallel calculation mode, the throughput rate of the system data is improved, and the decoding delay is merely in us level.

In the disclosure, the original mode of sliding window traceback is also changed, decoding result is output by one traceback, the traceback depth is two times of the encoding length, but the second section traceback data in the traceback depth is only valid. The accumulated values and state measurement values needn't to be stored. The method is simple and efficient, and the performance of the system is also improved.

The disclosure further proposes a novel anti-overflow mode of accumulated path measurement value, the implementation is easier, and the bit width of the accumulated path measurement value (also referred to as the accumulated value) may be reduced.

In the disclosure, the input data for decoding is stored in an interleaved mode, data input and decoding may be performed simultaneously, so that the problem of processing delay caused by waiting for decoding is solved.

The implementation of the purpose, function features and advantages of the disclosure will be further described with reference to drawings and embodiments.

DETAILED DESCRIPTION OF THE EMBODIMENTS

It should be understood that, specific embodiments described herein are only used for explaining the disclosure, not for limiting the disclosure.

Figure 1:
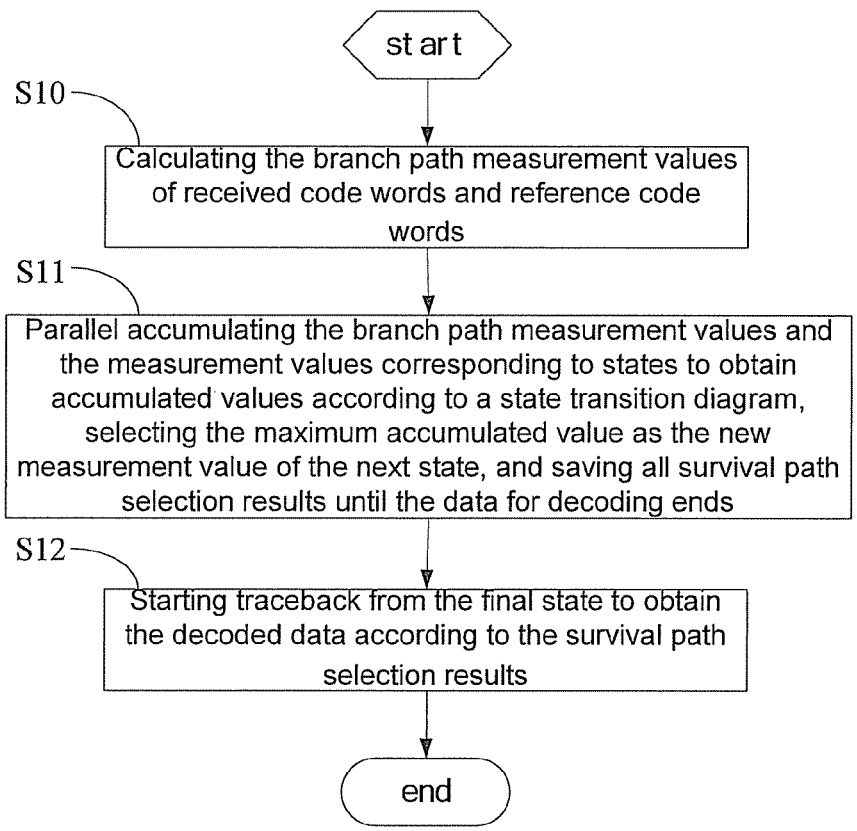
FIG. 1 is a flow diagram of a method for implementing Viterbi decoding according to the embodiments of the present disclosure.

FIG. 1 is a flow diagram of a method for implementing Viterbi decoding according to the embodiment of the present disclosure.

In the present embodiment, the method for implementing Viterbi decoding comprises the following steps:

Step S10: Calculating the branch path measurement values of received code words and reference code words;

The received code words are the data for decoding, and the reference code words are the state output values of the encoder. The state output values of the encoder and the data for decoding are correlatively calculated to obtain the branch path measurement values.

The present embodiment is mainly used for decoding error correction codes in a data mobile communication system, for example, the 3rd-Generation (3G) mobile communication technology and Long Term Evolution (LTE) project. Details description will be given below by taking the tail biting convolutional encoder provided in the 3GPP TS36.212 standard as example.

Figure 2:
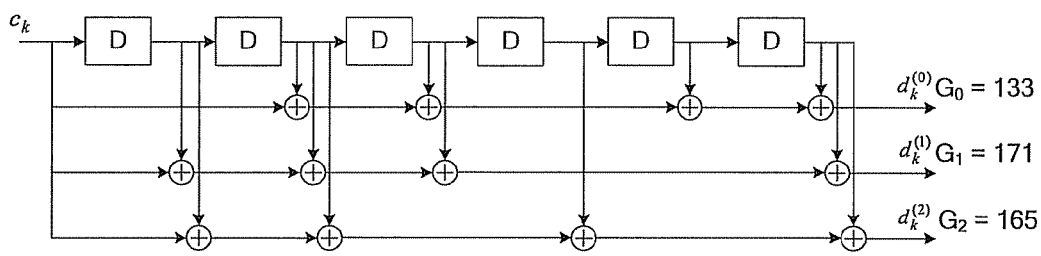
FIG. 2 is a structure diagram of a tail biting convolutional encoder according to the related art of the present disclosure.

With reference to FIG. 2, for the tail biting convolutional encoder provided in the 3GPP TS36.212 standard, there are total six shift registers D, the code rate is ⅓, the input signal at each moment is $C_k$, the output corresponding to each moment is $d_k^{(2)}$, $d_k^{(1)}$ and $d_k^{(0)}$ in a descending order, correspondingly, the octal encoding polynomial is $G_2$, $G_1$ and $G_0$, therefore, there are $2^6=64$ states during each calculation, respectively: $S_0$, $S_1$, $S_2$, ..., $S_{63}$, and the six registers are expressed by vector: dd[5:0], wherein dd[0] is the trigger corresponding to input.

dd changes during the encoding process: ddt[5:0]={ddt−1 [5:0], din}, from this formula, it may be seen that there are two dds reaching one $S_t$ state: {0, ddt−1 [4:0]} and {1, ddt−

1[4:0]}, and they meet: ddt[5:1]=ddt−1[4:0], ddt[0]=din. It also may be seen that both {0, ddt−1[4:0]} and {1, ddt−1[4:0]} may reach two states {ddt−1 [4:0], 0} and {ddt−1 [4:0], 1}.

Specifically, during the convolutional encoding process, at T moment, two states $S_k$ and $S_{k+32}$ (k=0 to 31) may reach states $S_{2k}$ and $S_{2k+1}$, $S_{2k}$ is corresponding to input 0, and $S_{2k+1}$ is corresponding to input 1. The highest bits of $S_k$ and $S_{k+}32$ are respectively corresponding to 0 and 1, as shown in the encoding/decoding state transition diagram in FIG. 3. For example, by related calculation, it may be known that the branch path measurement values from $S_k$ to $S_{2k}$ and from $S_k$ to $S_{2k+1}$ are respectively 5 and 3, and the branch path measurement values from $S_{k+32}$ to $S_{2k}$ and from $S_{k+32}$ to $S_{2k+1}$ are respectively 13 and 10.

Figure 4:
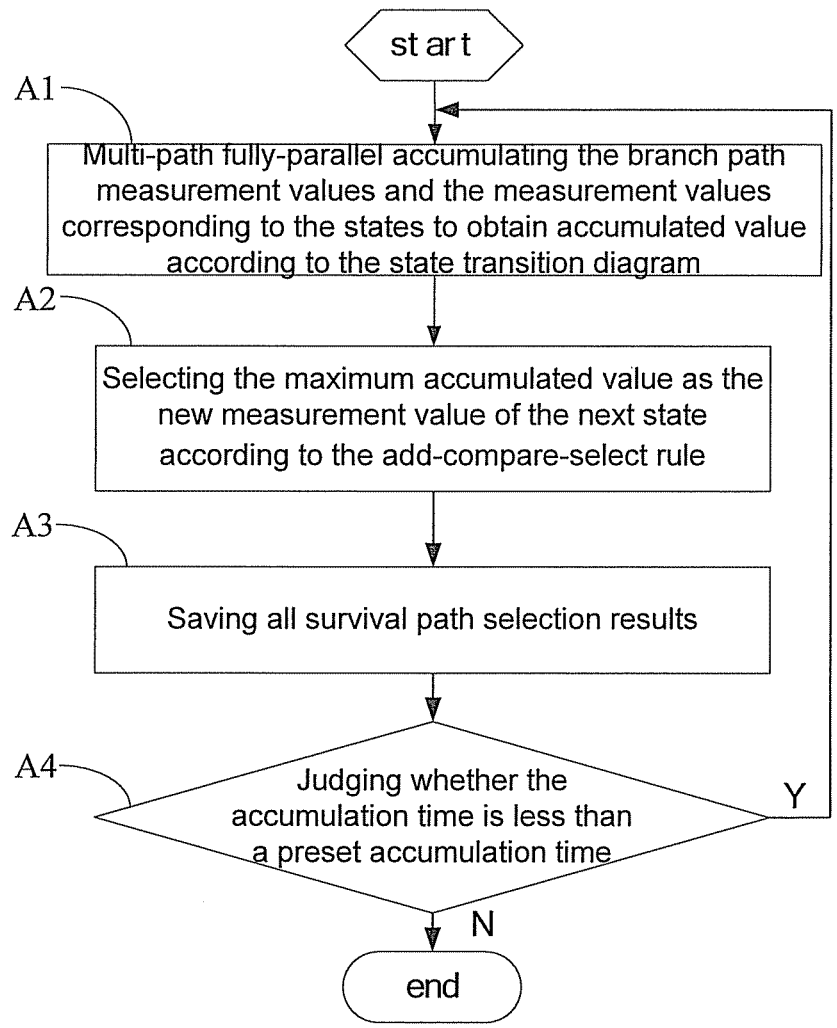
FIG. 4 is a flow diagram of accumulated path measurement values according to one embodiment of a method for implementing Viterbi decoding of the present disclosure.

Step S11: Parallel accumulating the branch path measurement values and the measurement values corresponding to states to obtain accumulated values according to a state transition diagram, selecting the maximum accumulated value as the new measurement value of the next state, and saving all survival path selection results until the data for decoding ends;

With reference to FIG. 4, Step S11 may specifically comprise:

Step A1: Multi-path fully-parallel accumulating the branch path measurement values and the measurement values corresponding to the states to obtain accumulated value according to the state transition diagram;

According to the state transition diagram, by means of multi-path (for example, 32-path) fully-parallel, the branch path measurement values and the measurement values corresponding to the states are accumulated to obtain accumulated values. For example, at T−1 moment, the measurement value of $S_k$ is 26, the measurement value of $S_{k+32}$ is 15, and the branch path measurement values from $S_k$ to $S_{2k}$ and from $S_k$ to $S_{2k+1}$ are respectively 5 and 3, while the branch path measurement values from $S_{k+32}$ to $S_{2k}$ and from $S_{k+32}$ to $S_{2k+1}$ are respectively 13 and 10, by accumulating the branch path measurement values and the measurement values corresponding to the states it may be known that, the path accumulated values reaching $S_{2k}$ are respectively 26+5=31 and 15+13=28, and the path accumulated values reaching $S_{2k+1}$ are respectively 26+3=29 and 15+10=25.

Step A2: Selecting the maximum accumulated value as the new measurement value of the next state according to the add-compare-select rule;

According to the add-compare-select rule, the path accumulated values of two branches reaching a same state are compared, the maximum path accumulated value is selected as the new measurement value of the state, the selection results are recorded until the data for decoding ends. For example, according to Step A2, the maximum path accumulated value 31 will be selected as the new measurement value of $S_{2k}$, and the maximum path accumulated value 29 will be selected as the new measurement value of $S_{2k+1}$. Therefore, at T moment, the measurement values of $S_{2k}$ and $S_{2k+1}$ are respectively 31 and 29, which are used as measurement values corresponding to states for accumulation operation at T+1 moment.

Step A3: Saving all survival path selection results;

According to the selection results in Step A2, all survival path selection results are saved to form one survival path, according to which the initial state is backtracked latter.

Step A4: Judging whether the accumulation time is less than a preset accumulation time, if so, returning to execute Step A1; otherwise, ending the accumulation flow.

The preset accumulation time depends on both the length of the code block and the circulation time of the external decoding.

Step S12: Starting traceback from the final state to obtain the decoded data according to the survival path selection results.

After the data for decoding ends, the corresponding survival path selection results are obtained by Step S11, in Step S12, traceback may be started from the final state to obtain the decoded data. The final state may be state 0, and also may be any state.

In this step, as the encoding mode of the encoder has been determined before encoding, the reference code words or the called encoding polynomial have been determined, how to perform butterfly accumulation in Step S11 according to the branch path measurement values obtained in Step S10 depends on calculation and selection of the states of the reference code words and the input code words, and the selection has to be performed in the add-compare-select interior. While in the present disclosure, according to add-compare-select fully-parallel accumulation and the state transition feature of the encoder, a lot of circuits for 32-path parallel calculation fixed option may be reduced, and the system resources may be saved.

In the present embodiment, by modifying the traditional serial or serial-parallel mixed mode for calculating the accumulated path measurement values to a multi-path fully-parallel calculation mode, the throughput rate of the system data is improved, and the decoding delay is merely in us level.

Figure 5:
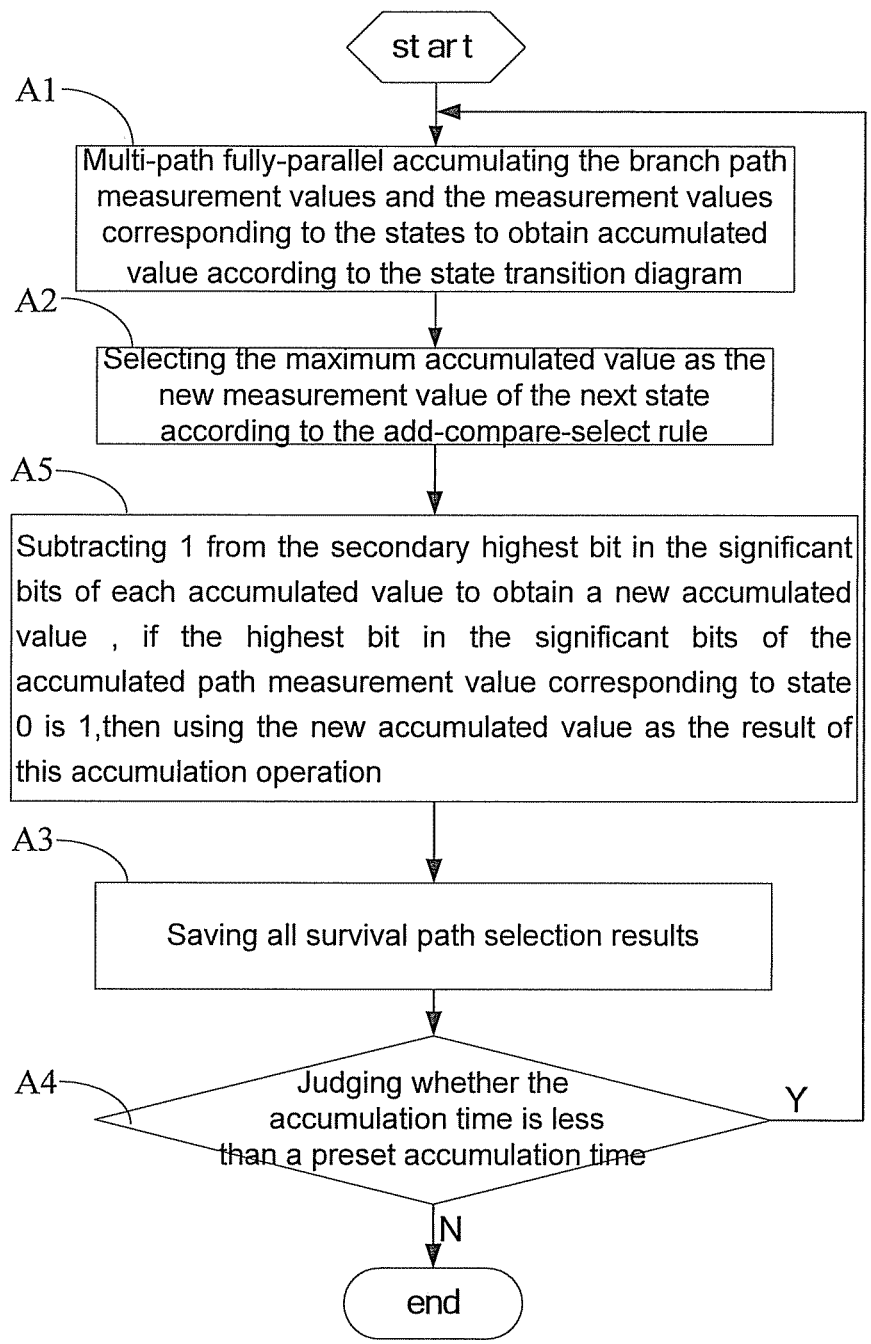
FIG. 5 is a flow diagram of accumulated path measurement values according to another embodiment of a method for implementing Viterbi decoding of the present disclosure.

In the present embodiment, when the accumulated path measurement value is calculated, a large amount of resources will be wasted if the bit width is not limited. For example, four times of decoding circulation are performed, the length of the code block is 128, the bit width of the input data for decoding is 8-bit, so the bit width of the accumulated path measurement values is 19-bit ($2^8*3*128*4=2^{19}$), at least 64 accumulated path measurement value registers are needed, so that the waste of resources is relatively serious. Therefore, in order to reduce the waste of resources, with reference to FIG. 5, after Step A2, the method may further comprise:

Step A5: Subtracting 1 from the secondary highest bit in the significant bits of each accumulated value to obtain a new accumulated value, if the highest bit in the significant bits of the accumulated path measurement value corresponding to state 0 is 1, then using the new accumulated value as the result of this accumulation operation.

First, it is necessary to judge whether the highest bit in the significant bits (if signed digits are available, significant bits are data bits other than sign bits) of the accumulated path measurement value corresponding to state 0 is 1, if so, the secondary highest bit in the significant bits of each accumulated values is subtracted by 1, that is, the whole measurement value is simply normalized to zero. For example, by taking 14-bit accumulated path measurement value as example, when distance0[12] is zero, normal operation is performed, and the generated subtraction enabling signal sub_en is in low level; when distance0[12] is 1, the generated subtraction enabling signal sub_en is in high level, so that all survival paths are subtracted by 0x800 (hexadecimal), i.e., the secondary highest bit in the significant bits of distance0, to prevent the overflow of the accumulated measurement value effectively.

The traditional anti-overflow step mainly depends on the selection of the fixed value, and it is necessary to compare all path measurement values and select the minimum one as the fixed value, instead, the anti-overflow step in the present embodiment may save a lot of comparison and selection circuits and the subtraction circuit is quite simple as it is only aimed at subtracting the three top bits of the accumulated measurement value by 1.

In the present embodiment, in Step S12, the traceback depth is two times of the encoding length. The specific traceback process is: from Step S11, the initial state of traceback may be obtained as max_num[5:0]=0, the front state of the initial state is max_num[5:0]={qqq[max_num], max_num[5:1]}, herein, qqq is the recorded 64-bit survival path value. When the recorded survival path selection result qqq has to be selected for traceback, the traceback depth is about 2*block_size, the output result of decoding after traceback is dec_bit=max_num[0]. When data is output, traceback data obtained in a depth the first time of the encoding length is abandoned, only traceback data obtained in a depth the second time of the encoding length is used, therefore, traceback data obtained in a depth only one time of the encoding length is stored, no much thing is added in terms of resources. The reason for the application of traceback depth that is two times of the encoding length is that, normal convolutional codes are replaced with tail biting convolutional codes in the high-speed decoding system, after emulation, it is found that the performance of the decoder is improved by 0.2 db to 0.3 db in comparison with traceback in a depth that is one time of the encoding length, therefore, in the present disclosure, the application of traceback depth that is two times of the encoding length guarantees the performance of the system. Furthermore, compared with multi-step traceback according to the length of window in the traditional mode of sliding window traceback, the control in the present disclosure is simpler, and the implementation is more convenient.

The traceback control depends on the circulation time of external decoding(max_times). When the external time sequence control condition en_6s&(~en_5s)=1 is met, the internal circulation count max_cnt is judged whether to be equal to max_times, if so, decoding is stopped, and the circulation counter(max_cnt) is zeroed; otherwise decoding is started again, the internal decoding start flag(trace_flag) is set as 1, and the max_cnt is added by 1. Herein, starting traceback to output the decoded result is only a simplified expression, it actually also comprises address reading of the given survival path and a plurality of operations such as corresponding control and storage. Theoretically, the more the circulation times, the better the performance of the decoder, however, by means of emulation, when the circulation times are more than four circles, the performance of the decoder is improved slightly, but the caused resource consumption is increased greatly, therefore, the value of the circulation time (max_times) is preferably between two circles and four circles.

In the present embodiment, after Step S11, after data for decoding ends, six zeros may be input again, and Step S11 may be repeated. Because when the decoding circulation times are reached (that is, data for decoding ends), in all state measurements, only one state is corresponding to the maximum accumulated path measurement value, if traceback is performed at this time, it is necessary to store the state measurement value in each time of calculation in Step S11, to obtain the state measurement value corresponding to the maximum path measurement. In the present disclosure, in order to save the storage space of the state measurement, after the data for decoding ends, six zeros may be input again and Step S11 may be repeated. As the encoder comprises six shift registers, the add-compare-select internal comparator is multiplexed, after six times of add-compare-select calculation, the path measurement values corresponding to all states are equal to the maximum path measurement value, so that the initial state may be backtracked according to the survival path, that is, no state measurement value needs to be stored. It should be understood that, during the traceback in Step S12, the traceback length is increased by 6. Therefore, in Step S12 in the embodiment, the traceback depth is two times of the encoding length plus 6.

Figure 6:
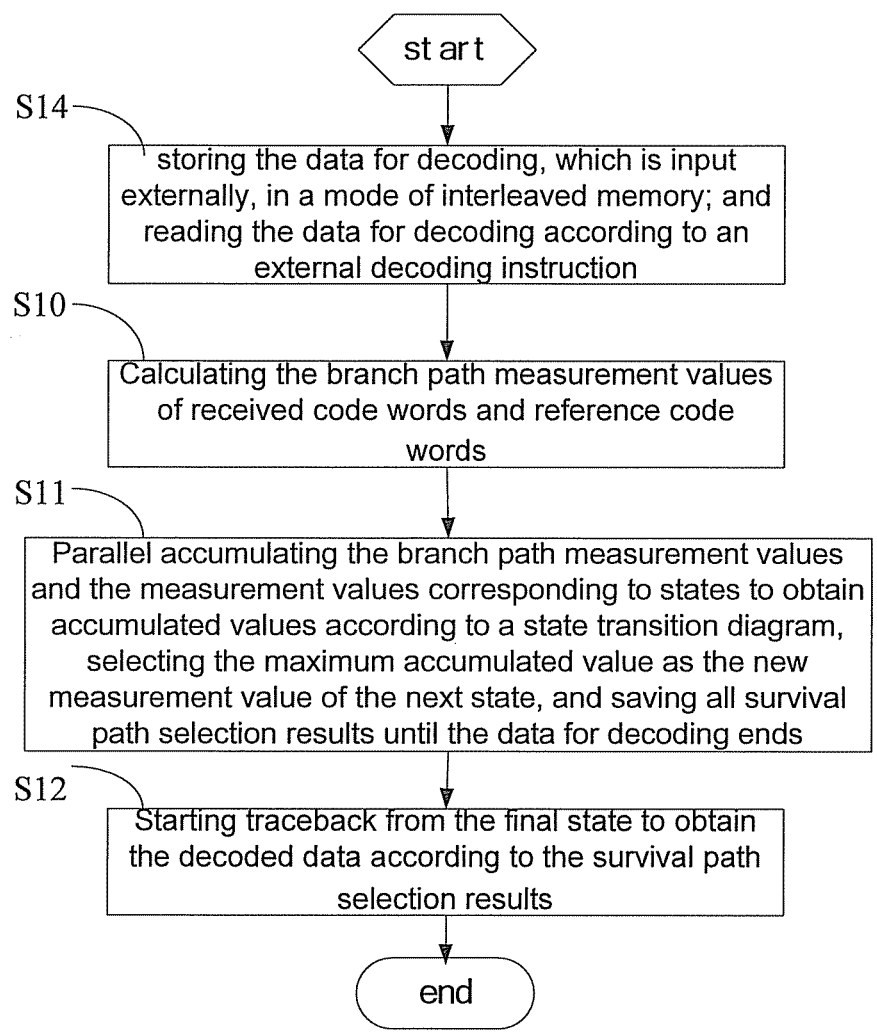
FIG. 6 is a flow diagram of a method for implementing Viterbi decoding according to still another embodiment of the present disclosure.

With reference to FIG. 6, in the embodiment, before Step S10, the method further comprises Step S14: storing the data for decoding, which is input externally, in a mode of interleaved memory; and reading the data for decoding according to an external decoding instruction.

Figure 7:
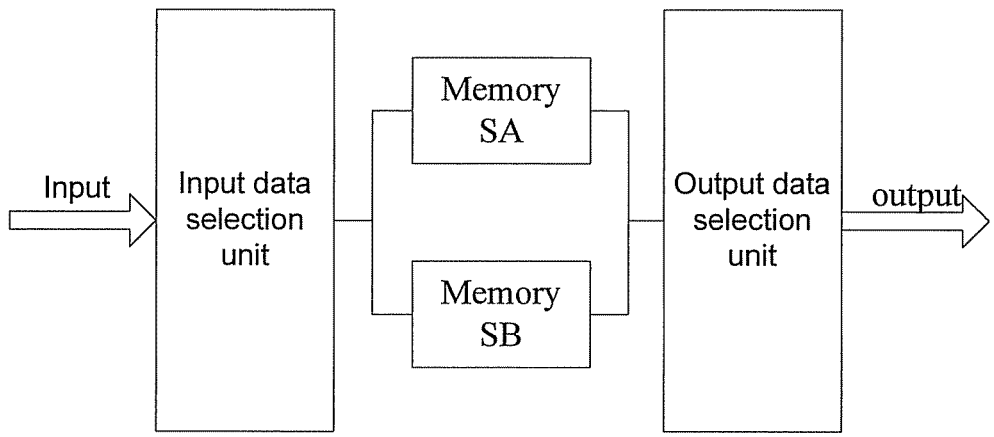
FIG. 7 is a structure diagram of an interleaved memory in a method for implementing Viterbi decoding according to one embodiment of the present disclosure.

When the external decoding instruction is received, the data for decoding, which is stored in the interleaved memories, is read in different time. With reference to FIG. 7, a structure diagram of an interleaved memory is illustrated. The interleaved memory comprises two memories SA and SB. First, the two interleaved memories are judged to check whether they are in idle state, if so, the new data for decoding is allowed to be written into the interleaved memories; otherwise the new data for decoding is prohibited to be written into the interleaved memories. It is allowed to read the data for decoding from the other memory while the data for decoding is written into one memory. For example, at the time of the first scene, the input data is cached to the memory SA, and at the time of the second scene, by means of switchover of the input data selection unit, the input data stream is cached to the memory SB, simultaneously, data in the memory SA may be sent out by means of selection of the output data selection unit. At the time of the third scene, the input data stream is cached to the memory SA, simultaneously, data in the memory SB may be sent out by means of switchover of the output data selection unit. In this way of circulation, seamless buffering of data may be realized, and the post parallel processing speed is greatly improved.

In the present embodiment, according to the maximum encoding length supported by the decoder, a memory structure including a group of interleaved memories is employed, each group may include three single-port RAMs respectively used for storing three paths of data g0, g1 and g2 output by the encoder. In this way, the next group of data for decoding may be prepared simultaneously while Viterbi decoding is performed, by means of interleaved memories, the processing delay caused by waiting for storing data during the decoding process is effectively reduced.

Figure 8:
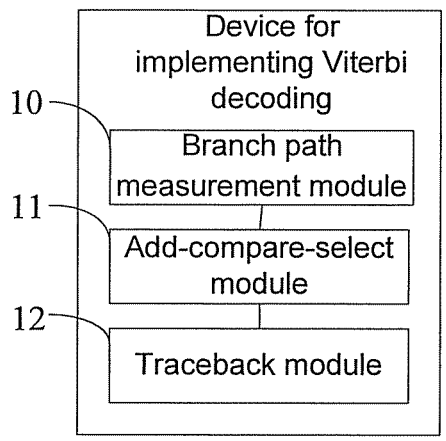
FIG. 8 is a structure diagram of a device for implementing Viterbi decoding according to one embodiment of the present disclosure.

FIG. 8 is a structure diagram of a device for implementing Viterbi decoding according to one embodiment of the present disclosure.

In the embodiment, the device for implementing Viterbi decoding comprises: a branch path measurement module 10, an add-compare-select module 11 and a traceback module 12; wherein, The branch path measurement module 10 is configured to calculate the branch path measurement values of received code words and reference code words;

The add-compare-select module 11 is configured to parallel accumulate the measurement values corresponding to the states and the branch path measurement values to obtain accumulated values according to a state transition diagram, select the maximum accumulated value as the new measurement value of the next state, and save all survival path selection results until the data for decoding ends;

The traceback module 12 is configured to start traceback from the final state to obtain the decoded data according to the survival path selection results.

Figure 3:
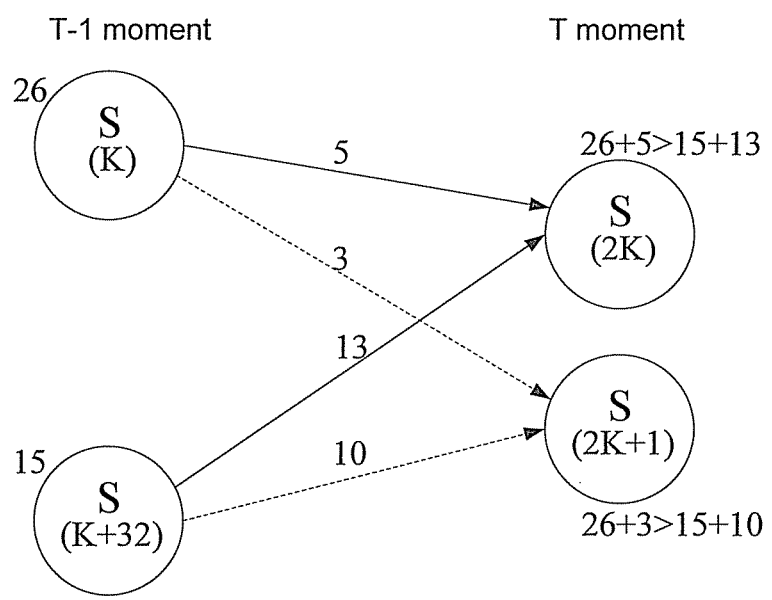
FIG. 3 is a state transition diagram of a tail biting convolutional encoder according to the related art of the present disclosure.

The received code words are the data for decoding, and the reference code words are the state output values of the encoder. The branch path measurement module 10 correlatively calculates the state output values of the encoder and the data for decoding to obtain the branch path measurement values. From the encoding/decoding state transition diagram as shown in FIG. 3, by related calculation, it may be known that the branch path measurement values from $S_k$ to $S_{2k}$ and from $S_k$ to $S_{2k+1}$ are respectively 5 and 3, and the branch path measurement values from $S_{k+32}$ to $S_{2k}$ and from $S_{k+32}$ to $S_{2k+1}$ are respectively 13 and 10.

Figure 9:
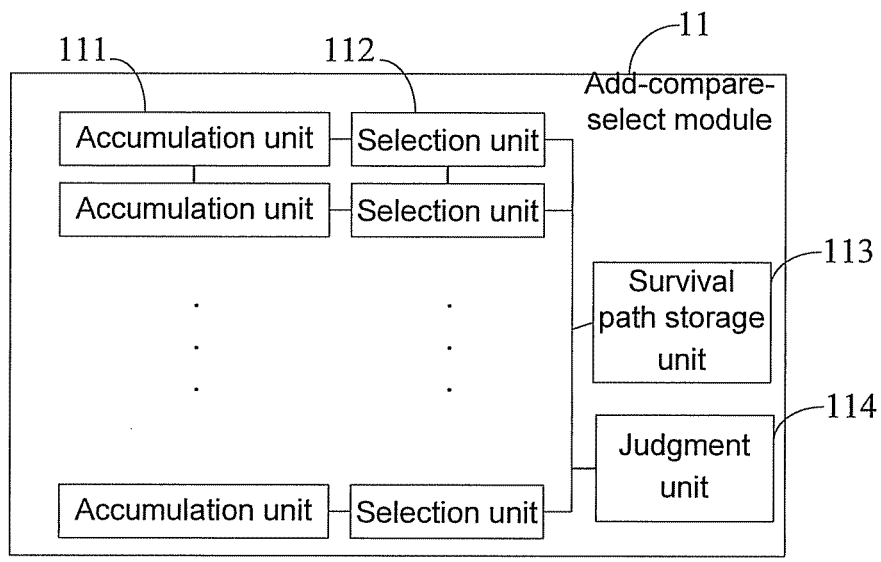
FIG. 9 is a structure diagram of an add-compare-select module in a device for implementing Viterbi decoding according to one embodiment of the present disclosure.

With reference to FIG. 9, the add-compare-select module 11 specifically comprises: an accumulation unit 111, a selection unit 112, a survival path storage unit 113 and a judgment unit 114; wherein, The accumulation unit 111 is configured to multi-path fully-parallel accumulate the measurement values corresponding to the states and the branch path measurement values to obtain the accumulated values according to the state transition diagram;

The selection unit 112 is configured to select the maximum accumulated value as the new measurement value of the next state according to the add-compare-select rule;

The survival path storage unit 113 is configured to save all survival path selection results;

The judgment unit 114 is configured to return to execute the next accumulation operation when the accumulation time is less than preset accumulation time; and end the accumulation flow when the accumulation time is more than or equal to the preset accumulation time.

According to the state transition diagram, by means of 32-path fully-parallel, the accumulation unit 111 accumulates the measurement values corresponding to the states and the branch path measurement values to obtain the accumulated values. For example, at T−1 moment, the measurement value of $S_k$ is 26, the measurement value of $S_{k+32}$ is 15, and the branch path measurement values from $S_k$ to $S_{2k}$ and from $S_k$ to $S_{2k+1}$ are respectively 5 and 3, while the branch path measurement values from $S_{k+32}$ to $S_{2k}$ and from $S_{k+32}$ to $S_{2k+1}$ are respectively 13 and 10, by accumulating the measurement values corresponding to the states and the branch path measurement values, it may be known that, the path accumulated values reaching $S_{2k}$ are respectively 26+5=31 and 15+13=28, and the path accumulated values reaching $S_{2k+1}$ are respectively 26+3=29 and 15+10=25. the selection unit 112 selects the maximum accumulated value as the new measurement value of the next state according to the add-compare-select rule. That is, it selects the maximum path accumulated value 31 as the new measurement value of $S_{2k}$ and the maximum path accumulated value 29 as the new measurement value of $S_{2k+1}$. Simultaneously, the survival path storage unit 113 will save the path measurement value of each time of selection, and the accumulation unit 111 ends the accumulation operation until the judgment unit 114 judges that the accumulation time is more than or equal to the preset accumulation time.

In the embodiment, by modifying the traditional serial or serial-parallel mixed mode for calculating the accumulated path measurement values to a multi-path fully-parallel calculation mode, the throughput rate of the system data is improved, and the decoding delay is merely in us level.

Figure 10:
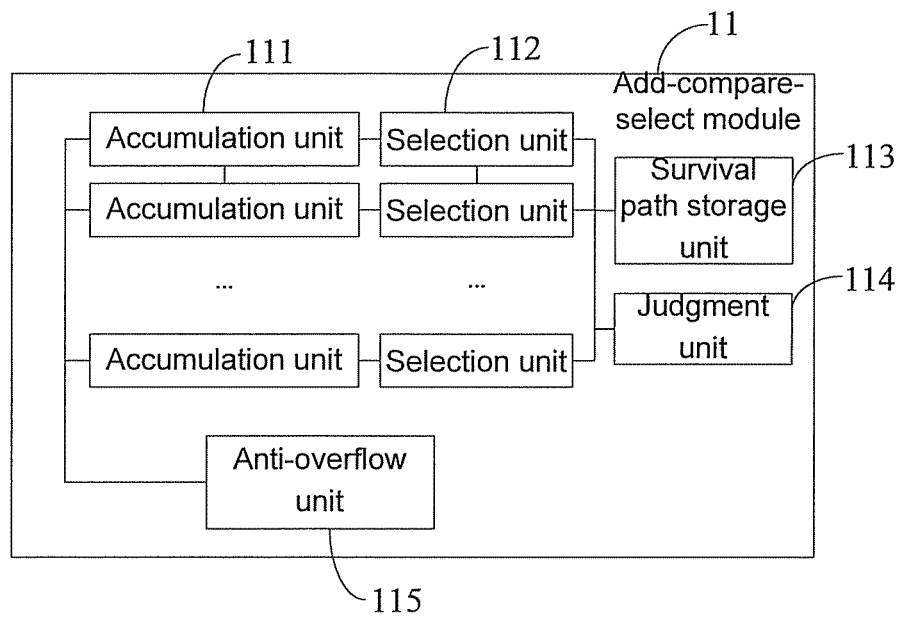
FIG. 10 is a structure diagram of an add-compare-select module in a device for implementing Viterbi decoding according to another embodiment of the present disclosure.

With reference to FIG. 10, the add-compare-select module in the embodiment further comprises:

An anti-overflow unit 115, configured to subtract 1 from the secondary highest bit in the significant bits of each accumulated value to obtain a new accumulated value, if the highest bit in the significant bits of the accumulated path measurement value corresponding to state 0 is 1, then use the new accumulated value as the result of this accumulation operation.

In the embodiment, when the accumulated path measurement value is calculated, a large amount of resources will be wasted if the bit width of the accumulated path measurement value is not limited. For example, four times of decoding circulation are performed, the length of the code block is 128, the bit width of the input data for decoding is 8-bit, so the bit width of the accumulated path measurement values is 19-bit ($2^8*3*128*4=2^{19}$), at least 64 accumulated path measurement value registers are needed, so that the waste of resources is relatively serious. Therefore, the anti-overflow unit 114 judges whether the highest bit in the significant bits (if signed digits are available, significant bits are data bits other than sign bits) of the each accumulated path measurement value corresponding to state 0 is 1, if so, it respectively subtracts the secondary highest bit in the significant bits of all obtained accumulated values by 1, that is, it simply normalizes the whole measurement values to zero. For example, by taking 14-bit accumulated path measurement values as example, when distance0[12] is zero, normal operation is performed, and the generated subtraction enabling signal sub_en is in low level; when distance0[12] is 1, the generated subtraction enabling signal sub_en is in high level, so that all survival paths are subtracted by 0x800 (hexadecimal), i.e., the secondary highest bit in the significant bits of distance0, to prevent the overflow of the accumulated measurement values effectively.

The traditional anti-overflow step mainly depends on the selection of the fixed value, and it is necessary to compare all path measurement values and select the minimum one as the fixed value, instead, the anti-overflow step in the embodiment may save a lot of comparison, and selection circuits and the subtraction circuit is quite simple as it is only aimed at subtracting the three top bits of the accumulated measurement value by 1.

In the embodiment, in the traceback module 12, the traceback depth is two times of the encoding length. The specific traceback process is: from Step S11, the initial state of traceback may be obtained as max_num[5:0]=0, the front state of the initial state is max_num[5:0]={qqq[max_num], max_num[5:1]}, herein, qqq is the recorded 64-bit survival path value. When the recorded survival path selection result qqq has to be selected for traceback, the traceback depth is about 2*block_size, the output result of decoding after traceback is dec_bit=max_num[0]. When the data is output, traceback data obtained in a depth the first time of the encoding length is abandoned, only traceback data obtained in a depth the second time of the encoding length is used, therefore, the traceback data obtained in a depth only one time of the encoding length is stored, no much thing is added in terms of resources. The reason for the application of traceback depth that is two times of the encoding length is that, normal convolutional codes are replaced with tail biting convolutional codes in the high-speed decoding system, after emulation, it is found that the performance of the decoder is improved by 0.2 db to 0.3 db in comparison with traceback in a depth that is one time of the encoding length, therefore, in the disclosure, the application of traceback depth that is two times of the encoding length guarantees the performance of the system. Furthermore, compared with multi-step traceback according to the length of window in the traditional mode of sliding window traceback, the control in the disclosure is simpler, and the implementation is more convenient.

In the embodiment, the add-compare-select module 11 is further configured to, after data for decoding ends, input six zeros again and repeat the accumulation operation of the path measurement values. Because when the decoding circulation times are reached (that is, data for decoding ends), in all state measurements, only one state is corresponding to the maximum accumulated path measurement value, if traceback is performed at this time, it is necessary to store the state measurement value in each time of add-compare-select calculation of the add-compare-select module 11, to obtain the state measurement value corresponding to the maximum path measurement. Therefore, in the disclosure, in order to save the storage space of the state measurement, after data for decoding ends, six zeros are input again, and the accumulation of the path measurement value is repeated. As the encoder includes six shift registers, after six times of add-compare-select calculation, the path measurement values corresponding to all states are equal to the maximum path measurement value, so that the initial state may be backtracked according to the survival path, that is, no state measurement value needs to be stored. It should be understood that, when traceback is performed in allusion to the results saved in the add-compare-select module 11, the traceback length is increased by 6. Therefore, in the embodiment, the traceback depth employed by the traceback module 12 is two times of the encoding length plus 6.

Figure 11:
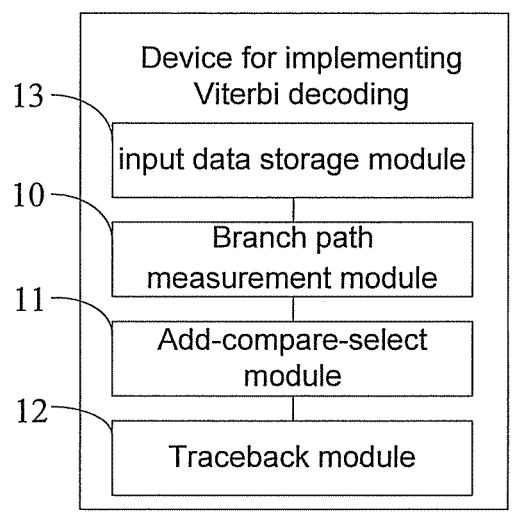
FIG. 11 is a structure diagram of a device for implementing Viterbi decoding according to still another embodiment of the present disclosure.

With reference to FIG. 11, a structure diagram of a device for implementing Viterbi decoding in still another embodiment of the disclosure is illustrated.

On the basis of the above embodiment, the device for implementing Viterbi decoding in the embodiment further comprises:

An input data storage module 13, configured to store the data for decoding, which is input externally, in a mode of interleaved memory; and read the data for decoding according to an external decoding instruction.

When the external decoding instruction is received, the data for decoding, which is stored in the interleaved memories, is read in different time. The input data storage module 13 comprises a group of interleaved memories, each group of memories consists of three small storage areas (for example, single-port RAM) respectively used for storing three paths of data g0, g1 and g2 output after being encoded. First, the interleaved memories are judged to check whether they are in idle state, if so, new data for decoding is allowed to be written into the interleaved memories; otherwise new data for decoding is prohibited to be written into the interleaved memories. It is allowed to read data for decoding from the other memory while data for decoding is written into one memory. The input data storage module 13 is mainly controlled by an external time sequence control module to send input data to the branch path measurement module 10 in parallel. Therefore, the next group of data for decoding may be prepared simultaneously while Viterbi decoding is performed, by means of interleaved memories, the processing delay caused by waiting for storing data during the decoding process is effectively reduced.

The descriptions above are only the preferable embodiment of the present disclosure, which are not used to restrict the present disclosure. For those skilled in the art, the present disclosure may have various changes and variations. Any amendments, equivalent substitutions, improvements, etc. within the principle of the present disclosure are all included in the scope of the protection of the present disclosure.

What is claimed is:

1. A method for implementing Viterbi decoding, comprising:
    calculating branch path measurement values of received code words and reference code words;
    parallel accumulating the branch path measurement values and measurement values corresponding to states to obtain accumulated values according to a state transition diagram, selecting a maximum accumulated value as a new measurement value of a next state, and saving all survival path selection results until data for decoding ends;
    starting traceback from a final state to obtain decoded data according to the survival path selection results; and
    wherein parallel accumulating the branch path measurement values and the measurement values corresponding to the states to obtain the accumulated values according to the state transition diagram, selecting maximum accumulated value as the new measurement value of the next state, and saving all survival path selection results until the data for decoding ends comprises: multi-path fully-parallel accumulating the branch path measurement values and the measurement values corresponding to the states to obtain the accumulated values according to the state transition diagram; selecting the maximum accumulated value as the new measurement value of the next state according to the add-compare-select rule, and saving all survival path selection results; and returning to execute a next accumulation operation when an accumulation time is less than a preset accumulation time and ending the accumulation flow when the accumulation time is more than or equal to the preset accumulation time.

2. The method for implementing Viterbi decoding according to claim 1, wherein before calculating the branch path measurement values of the received code words and the reference code words, the method further comprises:
    storing the data for decoding, which is input externally, in a mode of interleaved memory; and reading the data for decoding according to an external decoding instruction.

3. The method for implementing Viterbi decoding according to claim 1, wherein after multi-path fully-parallel accumulating the branch path measurement values and the measurement values corresponding to the states to obtain the accumulated values according to the state transition diagram, the method further comprises:
    subtracting 1 from the secondary highest bit in the significant bits of each accumulated value to obtain a new accumulated value, if the highest bit in the significant bits of the accumulated value corresponding to state 0 is 1, then using the new accumulated value as the result of this accumulation operation.

4. The method for implementing Viterbi decoding according to claim 1, wherein the traceback depth is two times of the encoding length.

5. A device for implementing Viterbi decoding, comprising: a branch path measurement module, an add-compare-select module and a traceback module; wherein,
    the branch path measurement module is configured to calculate branch path measurement values of received code words and reference code words;
    the add-compare-select module is configured to parallel accumulate the branch path measurement values and measurement values corresponding to states to obtain accumulated values according to a state transition diagram, select a maximum accumulated value as a new measurement value of a next state, and save all survival path selection results until data for decoding ends;
    the traceback module is configured to start traceback from a final state to obtain decoded data according to the survival path selection results; and
    wherein the add-compare-select module comprises: an accumulation unit, a selection unit, a survival path storage unit and a judgment unit; wherein the accumulation unit is configured to multi-path fully-parallel accumulate the branch path measurement values and measurement values corresponding to the states to obtain the accumulated values according to the state transition diagram; the selection unit is configured to select the maximum accumulated value as the new measurement value of the next state according to the add-compare-select rule; the survival path storage unit is configured to save all survival path selection results; and the judgment unit is configured to return to execute a next accumulation operation of the accumulation unit when an accumulation time is less than a preset accumulation time and end the accumulation flow when the accumulation time is more than or equal to the preset accumulation time.

6. The device for implementing Viterbi decoding according to claim 5, further comprising:
an input data storage module, configured to store the data for decoding, which is input externally, in a mode of interleaved memory; and read the data for decoding according to an external decoding instruction.

7. The device for implementing Viterbi decoding according to claim 5, wherein the add-compare-select module further comprises:
an anti-overflow unit, configured to subtract 1 from the secondary highest bit in the significant bits of each accumulated value to obtain a new accumulated value, if the highest bit in the significant bits of the accumulated value corresponding to state 0 is 1, then use the new accumulated value as the result of this accumulation operation.

8. The device for implementing Viterbi decoding according to claim 5 wherein the traceback depth employed by the traceback module is two times the encoding length.

9. The method for implementing Viterbi decoding according to claim 2, wherein the traceback depth is two times the encoding length.

10. The method for implementing Viterbi decoding according to claim 6, wherein the traceback depth is two times the encoding length.

11. The device for implementing Viterbi decoding according to claim 6 wherein the traceback depth employed by the traceback module is two times the encoding length.

12. The device for implementing Viterbi decoding according to claim 7 wherein the traceback depth employed by the traceback module is two times the encoding length.

* * * * *